(12) United States Patent
Hong (10) Patent No.: US 10,332,573 B2
(45) Date of Patent: Jun. 25, 2019

(54) SEMICONDUCTOR DEVICE AND SEMICONDUCTOR SYSTEM

(71) Applicant: SK hynix Inc., Icheon-si, Gyeonggi-do (KR)

(72) Inventor: Yun Gi Hong, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/482,076

(22) Filed: Apr. 7, 2017

(65) Prior Publication Data
US 2018/0090190 A1 Mar. 29, 2018

(30) Foreign Application Priority Data
Sep. 23, 2016 (KR) .................. 10-2016-0122150

(51) Int. Cl.
*G11C 7/22* (2006.01)
*H03K 5/156* (2006.01)
*G11C 7/10* (2006.01)
*G11C 5/14* (2006.01)

(52) U.S. Cl.
CPC ............... *G11C 7/22* (2013.01); *G11C 5/147* (2013.01); *G11C 7/10* (2013.01); *G11C 7/106* (2013.01); *G11C 7/1066* (2013.01); *G11C 7/1084* (2013.01); *G11C 7/1093* (2013.01); *G11C 7/222* (2013.01); *G11C 7/225* (2013.01); *H03K 5/1565* (2013.01)

(58) Field of Classification Search
CPC ............ H03K 5/1565; G05F 1/10; G11C 7/22
USPC ................................. 327/175, 547; 365/193
See application file for complete search history.

(56) References Cited

U.S. PATENT DOCUMENTS

| 2011/0007585 A1 | 1/2011 | Shan et al. | |
| 2013/0202061 A1* | 8/2013 | Chandrasekaran | ..... H04L 25/06 375/317 |
| 2013/0346721 A1* | 12/2013 | Giovannini | ............ G11C 7/222 711/167 |
| 2016/0197611 A1* | 7/2016 | Kang | ............. H03K 19/017509 365/189.07 |

FOREIGN PATENT DOCUMENTS

KR 1020110002302 A 1/2011

* cited by examiner

*Primary Examiner* — Amir Zarabian
*Assistant Examiner* — Jay W. Radke
(74) *Attorney, Agent, or Firm* — William Park & Associates Ltd.

(57) ABSTRACT

A semiconductor device includes a comparison circuit suitable for comparing a reference voltage and a strobe signal, and generating a first comparison strobe signal. The semiconductor device also includes a reference voltage training circuit suitable for sequentially changing a voltage level of the reference voltage if a training mode is entered, and setting the voltage level of the reference voltage by sensing a duty ratio of the first comparison strobe signal.

17 Claims, 9 Drawing Sheets

SEMICONDUCTOR DEVICE AND SEMICONDUCTOR SYSTEM

CROSS-REFERENCE TO RELATED APPLICATION

The present application claims priority under 35 U.S.C. § 119(a) to Korean Patent Application No. 10-2016-0122150 filed on Sep. 23, 2016 in the Korean Intellectual Property Office, which is incorporated herein by reference in its entirety.

BACKGROUND

1. Technical Field

Embodiments of the present disclosure relate to a semiconductor system including a semiconductor device which performs a training operation.

2. Related Art

In general, an integrated circuit including a semiconductor device includes a semiconductor system which receives an external signal inputted from an exterior and generates an internal signal. The external signal includes data, a data strobe signal, a command, an address, and/or so forth. The semiconductor system compares the external signal with a reference voltage, and generates the internal signal to be used in an internal circuit. The internal signal has a logic level according to a result of comparing the external signal and the reference voltage. For example, the logic level of the internal signal may be set to a logic high level if the external signal has a level higher than the reference voltage and to a logic low level if the external signal has a level lower than the reference voltage. The reference voltage inputted to the semiconductor system should be set to a level between a predetermined maximum level (VILmax) and a minimum level (VILmin). However, the level of the reference voltage may vary excessively due to the surroundings of the semiconductor system, the power noise of the semiconductor system, the wiring pattern of a PCB (printed circuit board), and the wiring pattern of a package. If the level of the reference voltage varies excessively, the semiconductor system may not properly determine the logic level of an external signal which is input to semiconductor device. Therefore, it is important to set the voltage level of the reference voltage so that the logic level of the external signal may be determined.

SUMMARY

Various embodiments are directed to a semiconductor system including a semiconductor device capable of training a reference voltage for determining the logic level of a strobe signal.

In an embodiment, a semiconductor device may include: a comparison circuit suitable for comparing a reference voltage and a strobe signal, and generating a first comparison strobe signal; and a reference voltage training circuit suitable for sequentially changing a voltage level of the reference voltage if a training mode is entered, and setting the voltage level of the reference voltage by sensing a duty ratio of the first comparison strobe signal.

In an embodiment, a semiconductor system may include: a first semiconductor device suitable for outputting data, a strobe signal, an inverted strobe signal, and a training entry signal; and a second semiconductor device suitable for generating a first comparison strobe signal by comparing a reference voltage and the strobe signal, and setting a voltage level of the reference voltage by sensing a duty ratio of the first comparison strobe signal through sequentially changing the voltage level of the reference voltage in the case where a training mode is entered in response to the training entry signal.

In an embodiment, a semiconductor system may include: a first semiconductor device suitable for outputting data, a strobe signal, an inverted strobe signal, and a training entry signal; and a second semiconductor device suitable for generating a first comparison strobe signal by comparing a reference voltage and the strobe signal, receiving the strobe signal which is set to a predetermined logic level, if a training mode is entered in response to the training entry signal, and setting a voltage level of the reference voltage to a value between a voltage level of the strobe signal and a voltage level of a power supply voltage.

DETAILED DESCRIPTION

Hereinafter, a semiconductor device and a semiconductor system will be described below with reference to the accompanying drawings through various examples of embodiments.

Figure 1:
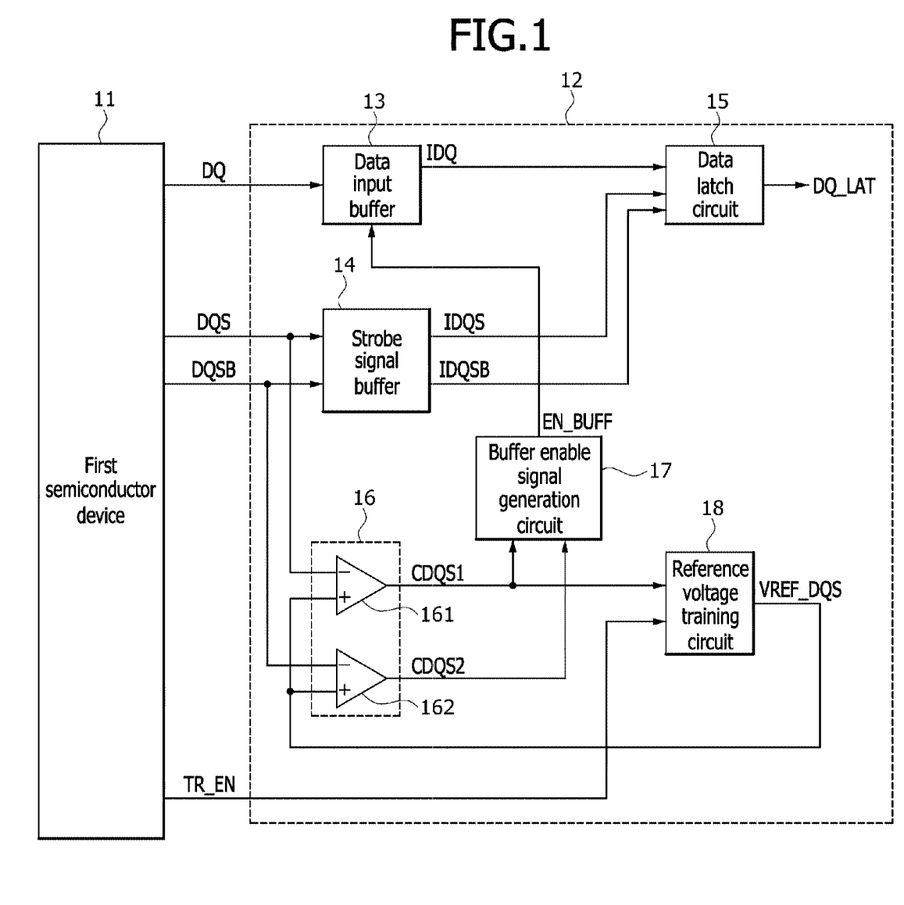
FIG. 1 is a block diagram illustrating a representation of an example configuration of a semiconductor system in accordance with an embodiment.

As shown in FIG. 1, a semiconductor system in accordance with an embodiment may include a first semiconductor device 11 and a second semiconductor device 12.

The first semiconductor device 11 may output data DQ, a strobe signal DQS, an inverted strobe signal DQSB, and a training entry signal TR_EN. The first semiconductor device 11 may output the data DQ, the strobe signal DQS and the inverted strobe signal DQSB when a write operation for the second semiconductor device 12 is performed. The first semiconductor device 11 may output the training entry signal TR_EN for entering a training mode. The training mode may be an operation for setting the voltage level of a reference voltage VREF_DQS which is generated in the second semiconductor device 12. The training entry signal TR_EN may be transmitted through a line through which a command, an address and data are transmitted. The first semiconductor device 11 may output the strobe signal DQS which toggles in the training mode.

The second semiconductor device 12 may include a data input buffer 13, a strobe signal buffer 14, a data latch circuit 15, a comparison circuit 16, a buffer enable signal generation circuit 17, and a reference voltage training circuit 18.

The data input buffer 13 may be enabled and buffer the data DQ and generate internal data IDQ, in response to a buffer enable signal EN_BUFF. The data input buffer 13 may buffer the data DQ and generate the internal data IDQ, for a period in which the buffer enable signal EN_BUFF is enabled.

The strobe signal buffer 14 may buffer the strobe signal DQS and the inverted strobe signal DQSB, and generate an internal strobe signal IDQS and an inverted internal strobe signal IDQSB. The strobe signal buffer 14 may generate the internal strobe signal IDQS by buffering the strobe signal DQS, and generate the inverted internal strobe signal IDQSB by buffering the inverted strobe signal DQSB. The strobe signal buffer 14 may be realized to include a divider circuit, according to an embodiment. The strobe signal buffer 14 including a divider circuit may divide the strobe signal DQS and the inverted strobe signal DQSB, and generate the internal strobe signal IDQS and the inverted internal strobe signal IDQSB.

The data latch circuit 15 may latch the internal data IDQ in response to the internal strobe signal IDQS and the inverted internal strobe signal IDQSB. The data latch circuit 15 may align the latched internal data IDQ, and generate latched data DQ_LAT.

The comparison circuit 16 may include a first comparator 161 and a second comparator 162.

The first comparator 161 may compare the strobe signal DQS and the reference voltage VREF_DQS, and generate a first comparison strobe signal CDQS1. The first comparator 161 may generate the first comparison strobe signal CDQS1 of a logic high level when the level of the strobe signal DQS is lower than the level of the reference voltage VREF_DQS. The first comparator 161 may generate the first comparison strobe signal CDQS1 of a logic low level when the level of the strobe signal DQS is higher than the level of the reference voltage VREF_DQS. The logic level of the first comparison strobe signal CDQS1 generated by comparing the strobe signal DQS and the reference voltage VREF_DQS may be set differently according to an embodiment.

The second comparator 162 may compare the inverted strobe signal DQSB and the reference voltage VREF_DQS, and generate a second comparison strobe signal CDQS2. The second comparator 162 may generate the second comparison strobe signal CDQS2 of a logic high level if the level of the inverted strobe signal DQSB is lower than the level of the reference voltage VREF_DQS. The second comparator 162 may generate the second comparison strobe signal CDQS2 of a logic low level if the level of the inverted strobe signal DQSB is higher than the level of the reference voltage VREF_DQS. The logic level of the second comparison strobe signal CDQS2 generated by comparing the inverted strobe signal DQSB and the reference voltage VREF_DQS may be set differently according to an embodiment.

The buffer enable signal generation circuit 17 may generate the buffer enable signal EN_BUFF which is enabled when the first comparison strobe signal CDQS1 and the second comparison strobe signal CDQS2 toggle to different logic levels.

The reference voltage training circuit 18 may sense the first comparison strobe signal CDQS1 and control the voltage level of the reference voltage VREF_DQS, in response to the training entry signal TR_EN. The reference voltage training circuit 18 sets a voltage level of the reference voltage VREF_DQS by sequentially changing the voltage level of the reference voltage VREF_DQS if the training mode is entered in response to the training entry signal TR_EN. The reference voltage training circuit 18 may set the voltage level of the reference voltage VREF_DQS by sensing the duty ratio of the first comparison strobe signal CDQS1. The reference voltage training circuit 18 may initialize the reference voltage VREF_DQS to a lowest voltage level if the second semiconductor device 12 enters the training mode. The reference voltage training circuit 18 may sense the duty ratio of the first comparison strobe signal CDQS1 which is generated in response to the reference voltage VREF_DQS set to the initial voltage level. For example, the reference voltage training circuit 18 may raise the reference voltage VREF_DQS by a predetermined voltage level if the first comparison strobe signal CDQS1 has a logic high level period shorter than a logic low level period. The reference voltage training circuit 18 may perform training by sequentially raising the voltage level of the reference voltage VREF_DQS, and fixing the voltage level of the reference voltage VREF_DQS and ending the training mode if a period in which the first comparison strobe signal CDQS1 has the logic high level period longer than the period in which the first comparison strobe signal has the logic low level period.

Figure 2:
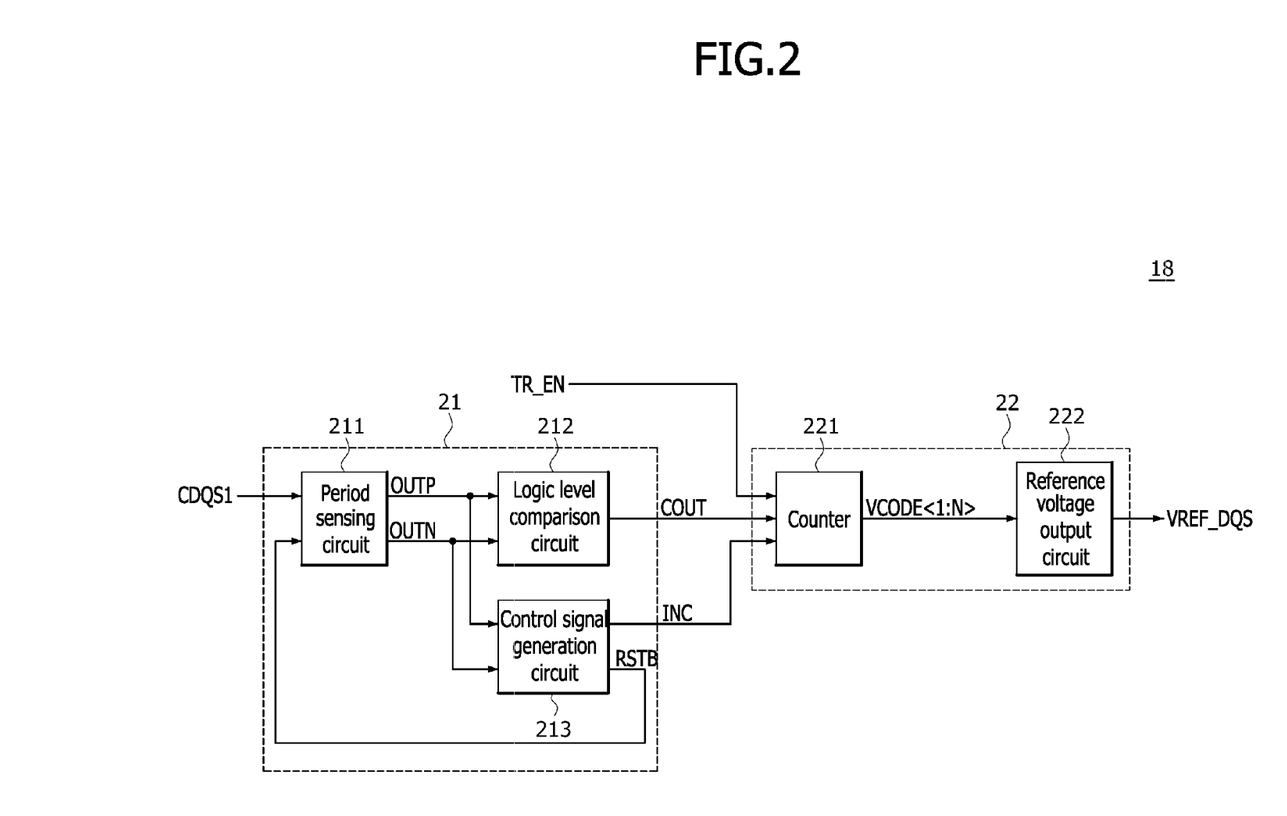
FIG. 2 is a block diagram illustrating a representation of an example reference voltage training circuit included in the semiconductor system shown in FIG. 1.

Referring to FIG. 2, the reference voltage training circuit 18 in accordance with the embodiment may include a duty ratio sensing circuit 21 and a reference voltage generation circuit 22.

The duty ratio sensing circuit 21 may include a period sensing circuit 211, a logic level comparison circuit 212, and a control signal generation circuit 213.

The period sensing circuit 211 may sense the duty ratio of the first comparison strobe signal CDQS1, and generate a first sensing signal OUTP and a second sensing signal OUTN. The period sensing circuit 211 may compare a period in which the first comparison strobe signal CDQS1 has the logic high level and a period in which the first comparison strobe signal CDQS1 has the logic low level, and generate the first sensing signal OUTP and the second sensing signal OUTN. The period sensing circuit 211 may generate the first sensing signal OUTP having a logic high level and the second sensing signal OUTN having a logic low level if the first comparison strobe signal CDQS1 has a logic low level period shorter than the logic high level period. The period sensing circuit 211 may generate the first sensing signal OUTP having a logic low level and the second sensing signal OUTN having a logic high level if the first comparison strobe signal CDQS1 has a logic low level period longer than the logic high level period. The period sensing circuit 211 may initialize the first sensing signal OUTP and the second sensing signal OUTN in response to a reset signal RSTB. The period sensing circuit 211 may initialize the first sensing signal OUTP and the second sensing signal OUTN to the logic high level in response to the reset signal RSTB.

The logic level comparison circuit 212 may generate a duty ratio sensing signal COUT in response to the first sensing signal OUTP and the second sensing signal OUTN. The logic level comparison circuit 212 may generate the duty ratio sensing signal COUT of a logic high level if the first sensing signal OUTP is the logic high level and the second sensing signal OUTN is the logic low level. The logic level comparison circuit 212 may generate the duty ratio sensing signal COUT of a logic low level if the first sensing signal OUTP is the logic low level and the second sensing signal OUTN is the logic high level. The logic level comparison circuit 212 may latch the duty ratio sensing signal COUT when the first sensing signal OUTP and the second sensing signal OUTN are the logic high levels.

The control signal generation circuit 213 may generate a counting signal INC and the reset signal RSTB in response to the first sensing signal OUTP and the second sensing signal OUTN. Further, the control signal generation circuit 213 may generate the counting signal INC and the reset sensing signal RSTB if the duty ratio of the first comparison strobe signal is sensed in response to the first sensing signal first sensing signal OUTP and the second sensing signal OUTN. The control signal generation circuit 213 may generate the counting signal INC which is enabled if the first sensing signal OUTP and the second sensing signal OUTN have different logic levels. The control signal generation circuit 213 may generate the counting signal INC of a logic high level if the first sensing signal OUTP and the second sensing signal OUTN are the logic high levels. The control signal generation circuit 213 may generate the counting signal INC of a logic low level if the first sensing signal OUTP is the logic high level and the second sensing signal OUTN is the logic low level. The control signal generation circuit 213 may generate the counting signal INC of the logic low level if the first sensing signal OUTP is the logic low level and the second sensing signal OUTN is the logic high level. The control signal generation circuit 213 may generate the reset signal RSTB in response to generating the counting signal INC. The control signal generation circuit 213 may generate the reset signal RSTB including a pulse of a logic low level if the counting signal INC is the logic low level. The control signal generation circuit 213 may generate the counting signal INC which is enabled to the logic low level if even one of the first sensing signal OUTP and the second sensing signal OUTN has the logic low level, and generate the reset signal RSTB including the pulse of the logic low level in response to the counting signal INC generated with a logic low level.

The reference voltage generation circuit 22 may include a counter 221 and a reference voltage output circuit 222.

The counter 221 may generate a voltage code VCODE<1:N> in response to the training entry signal TR_EN, the duty ratio sensing signal COUT, and the counting signal INC. The counter 221 may initialize the voltage code VCODE<1:N> in response to the training entry signal TR_EN. The counter 221 may count the voltage code VCODE<1:N> if the counting signal INC transitions from the logic high level to the logic low level in the state in which the duty ratio sensing signal COUT is the logic high level. The counter 221 may store the voltage code VCODE<1:N> and output the stored voltage code VCODE<1:N>, when the duty ratio sensing signal COUT transitions to the logic low level.

The reference voltage output circuit 222 may output the reference voltage VREF_DQS in response to the voltage code VCODE<1:N>. In another example, the reference voltage generation circuit 22 may initialize the reference voltage VREF_DQS in response to the training entry signal TR_EN which is enabled in the training mode. The reference voltage output circuit 222 may output the reference voltage VREF_DQS which has a level corresponding to the code value of the voltage code VCODE<1:N>. The reference voltage output circuit 222 may be constructed by a resistor string which includes a plurality of resistors, and output the reference voltage VREF_DQS which has a level corresponding to the voltage code VCODE<1:N>. The reference voltage output circuit 222 may be constructed by various circuits each capable of outputting the reference voltage VREF_DQS which has a level corresponding to the voltage code VCODE<1:N>, according to embodiments. In another example, the reference voltage generation circuit 22 may sequentially change the voltage level of the reference voltage VREF_DQS in response to the counting signal INC. Further, the reference voltage generation circuit 22 may set the voltage level of the reference voltage VREF_DQS in response to the duty ratio sensing signal COUT.

Figure 3:
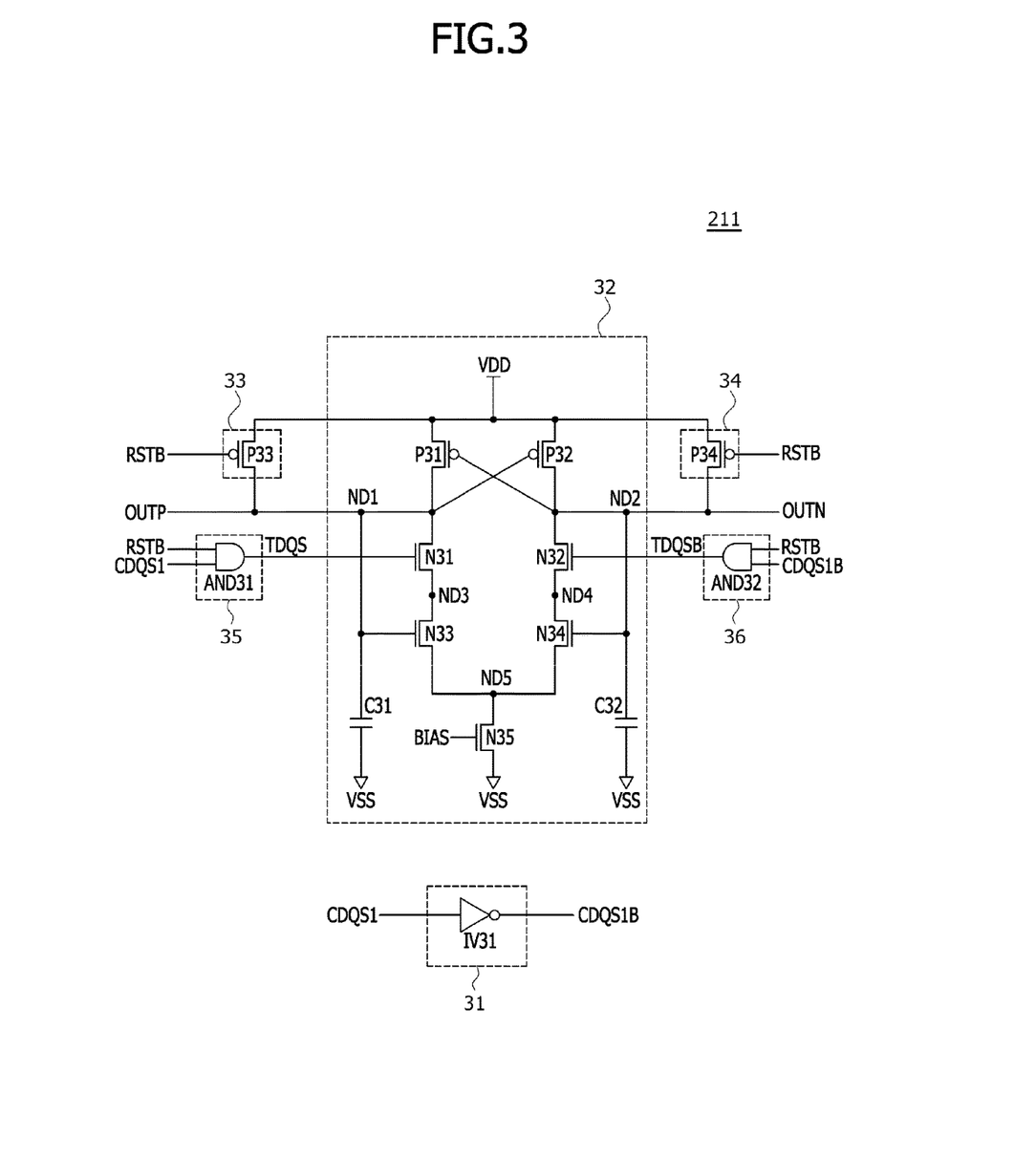
FIG. 3 is a circuit diagram illustrating a representation of an example period sensing circuit included in the reference voltage training circuit shown in FIG. 2.

Referring to FIG. 3, the period sensing circuit 211 may include an inversion circuit 31, a period comparison circuit 32, a first reset element 33, a second reset element 34, a first transfer circuit 35, and a second transfer circuit 36.

The inversion circuit 31 may include an inverter IV31. The inverter IV31 may invert and buffer the first comparison strobe signal CDQS1, and generate an inverted comparison strobe signal CDQS1B.

The period comparison circuit 32 may include PMOS transistors P31 and P32, NMOS transistors N31, N32, N33, N34 and N35, and capacitors C31 and C32. The PMOS transistor P31 may be coupled between a power supply voltage VDD and a first node ND1, and be turned on in response to voltage of a second node ND2. The first node ND1 may be a node from which the first sensing signal OUTP is outputted. The second node ND2 may be a node from which the second sensing signal OUTN is outputted. The PMOS transistor P32 may be coupled between the power supply voltage VDD and the second node ND2, and may be turned on in response to the voltage of the first node ND1. The NMOS transistor N31 may be coupled between the first node ND1 and a third node ND3, and may be turned on in response to a transfer strobe signal TDQS. The NMOS transistor N32 may be coupled between the second node ND2 and a fourth node ND4, and may be turned on in response to an inverted transfer strobe signal TDQSB. The NMOS transistor N33 may be coupled between the third node ND3 and a fifth node ND5, and may be turned on in response to the voltage of the first node ND1. The NMOS transistor N34 may be coupled between the fourth node ND4 and the fifth node ND5, and may be turned on in response to the voltage of the second node ND2. The NMOS transistor N35 may be coupled between the fifth node ND5 and a ground voltage VSS, and may be turned on in response to a bias voltage BIAS. The bias voltage BIAS may be a signal which has a constant voltage level after a power-up period. The capacitor C31 may be coupled between the first node ND1 and the ground voltage VSS. The capacitor C32 may be coupled between the second node ND2 and the ground voltage VSS. The power-up period may be set as a period in which the voltage level of an external voltage VDD supplied to a semiconductor device rises from 0V to a target voltage level with a predetermined gradient.

The first reset element 33 may include a PMOS transistor P33. The PMOS transistor P33 may be coupled between the power supply voltage VDD and the first node ND1, and may be turned on in response to the reset signal RSTB. The first reset element 33 may drive the first node ND1 to a logic high level in response to the pulse of the logic low level included in the reset signal RSTB, and thereby initialize the first sensing signal OUTP to the logic high level.

The second reset element 34 may include a PMOS transistor P34. The PMOS transistor P34 may be coupled between the power supply voltage VDD and the second node ND2, and may be turned on in response to the reset signal RSTB. The second reset element 34 may drive the second node ND2 to a logic high level in response to the pulse of the logic low level included in the reset signal RSTB, and thereby initialize the second sensing signal OUTN to the logic high level.

The first transfer circuit 35 may include an AND gate AND31. The AND gate AND31 may perform an AND logic function on the reset signal RSTB and the first comparison strobe signal CDQS1, and may generate the transfer strobe signal TDQS. The first transfer circuit 35 may transfer the first comparison strobe signal CDQS1 as the transfer strobe signal TDQS in response to the reset signal RSTB having a logic high level. The first transfer circuit 35 may block input of the first comparison strobe signal CDQS1 and generate the transfer strobe signal TDQS of a logic low level, if the reset signal RSTB has the logic low level.

The second transfer circuit 36 may include an AND gate AND32. The AND gate AND32 may perform an AND logic function on the reset signal RSTB and the inverted comparison strobe signal CDQS1B, and may generate the inverted transfer strobe signal TDQSB. The second transfer circuit 36 may transfer the inverted comparison strobe signal CDQS1B as the inverted transfer strobe signal TDQSB in response to the reset signal RSTB having the logic high level. The second transfer circuit 36 may block input of the inverted comparison strobe signal CDQS1B and generate the inverted transfer strobe signal TDQSB of a logic low level, if the reset signal RSTB has the logic low level.

In this way, the period sensing circuit 211 may initialize the first sensing signal OUTP and the second sensing signal OUTN to the logic high levels if the reset signal RSTB of the logic low level is inputted. If the reset signal RSTB of the logic high level is inputted, the period sensing circuit 211 may transfer the first comparison strobe signal CDQS1 as the transfer strobe signal TDQS and transfer the inverted comparison strobe signal CDQS1B as the inverted transfer strobe signal TDQSB. In the period comparison circuit 32, if the transfer strobe signal TDQS has a logic high level period shorter than that of the inverted transfer strobe signal TDQSB, because a period for which the NMOS transistor N32 is turned on is longer than a period for which the NMOS transistor N31 is turned on, the charges of the second node ND2 may be discharged more quickly than the charges of the first node ND1. If the charges of the second node ND2 are discharged and thus the second node ND2 has a logic low level, the PMOS transistor P31 may be turned on and the first node ND1 may have a logic high level. Accordingly, the period sensing circuit 211 may generate the first sensing signal OUTP of the logic high level and the second sensing signal OUTN of the logic low level. In the period comparison circuit 32, if the transfer strobe signal TDQS has the logic high level period longer than that of the inverted transfer strobe signal TDQSB, because a period for which the NMOS transistor N31 is turned on is longer than a period for which the NMOS transistor N32 is turned on, the charges of the first node ND1 may be discharged more quickly than the charges of the second node ND2. If the charges of the first node ND1 are discharged and thus the first node ND1 has a logic low level, the PMOS transistor P32 may be turned on and the second node ND2 may have a logic high level. Accordingly, the period sensing circuit 211 may generate the first sensing signal OUTP of the logic low level and the second sensing signal OUTN of the logic high level.

Figure 4:
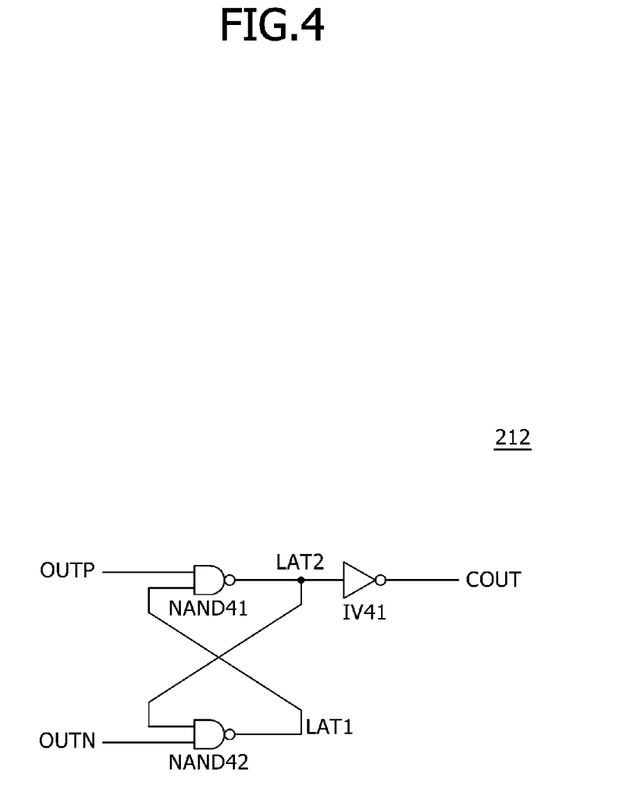
FIG. 4 is a circuit diagram illustrating a representation of an example logic level comparison circuit included in the reference voltage training circuit shown in FIG. 2.

Referring to FIG. 4, the logic level comparison circuit 212 may include NAND gates NAND41 and NAND42 and an inverter IV41. The NAND gate NAND41 may perform a NAND logic function on the first sensing signal OUTP and a first latch signal LAT1, and may generate a second latch signal LAT2. The NAND gate NAND42 may perform a NAND logic function on the second sensing signal OUTN and the second latch signal LAT2, and may generate the first latch signal LAT1. The inverter IV41 may invert and buffer the second latch signal LAT2, and may generate the duty ratio sensing signal COUT. The logic level comparison circuit 212 may generate the duty ratio sensing signal COUT of the logic high level if the first sensing signal OUTP is the logic high level and the second sensing signal OUTN is the logic low level. The logic level comparison circuit 212 may generate the duty ratio sensing signal COUT of the logic low level if the first sensing signal OUTP is the logic low level and the second sensing signal OUTN is the logic high level. If the first sensing signal OUTP and the second sensing signal OUTN are the logic high levels, the logic level comparison circuit 212 may latch the first latch signal LAT1 and the second latch signal LAT2, and may generate the duty ratio sensing signal COUT of a constant level.

Figure 5:
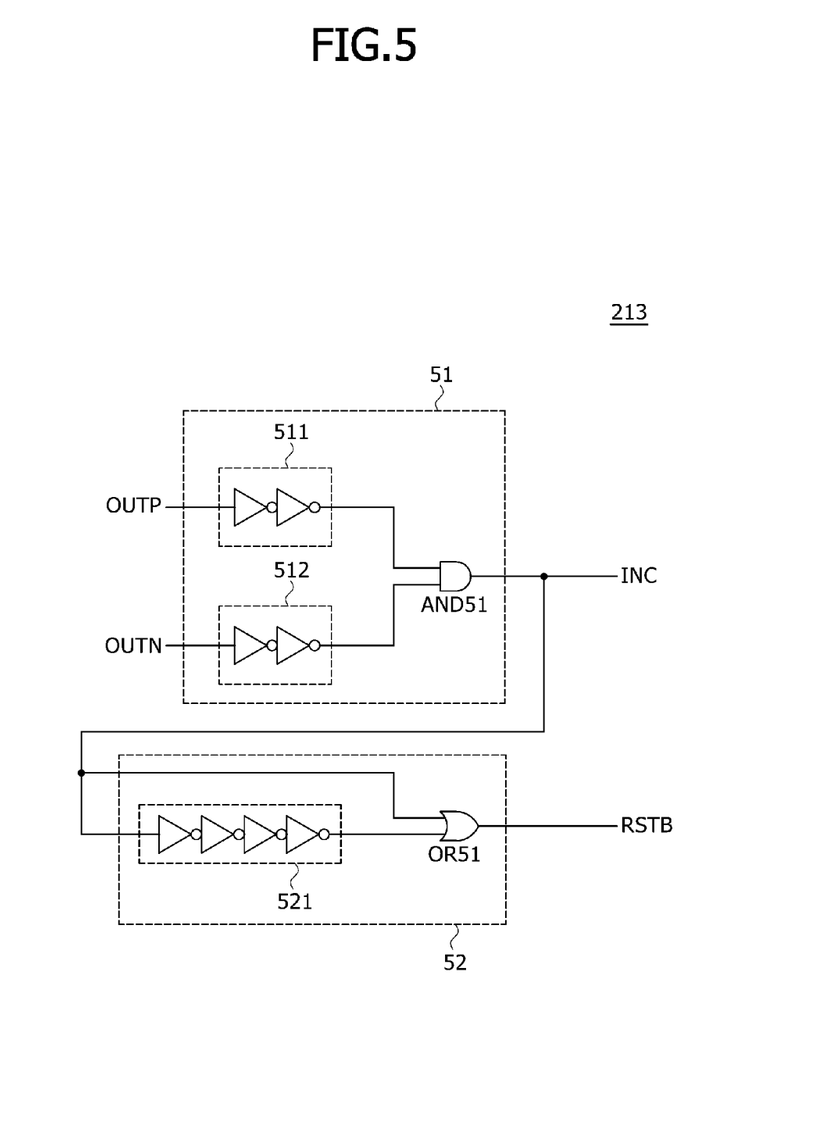
FIG. 5 is a circuit diagram illustrating a representation of an example control signal generation circuit included in the reference voltage training circuit shown in FIG. 2.

Referring to FIG. 5, the control signal generation circuit 213 may include a counting signal generation circuit 51 and a reset signal generation circuit 52.

The counting signal generation circuit 51 may include a first buffer 511, a second buffer 512, and an AND gate AND51. The first buffer 511 may buffer and output the first sensing signal OUTP. The second buffer 512 may buffer and output the second sensing signal OUTN. The AND gate AND51 may perform an AND logic function on the output of the first buffer 511 and the output of the second buffer 512, and may generate the counting signal INC. That is to say, the counting signal generation circuit 51 may generate the counting signal INC of the logic low level if even one of the first sensing signal OUTP and the second sensing signal OUTN is the logic low level. In another embodiment, the counting signal generation circuit 51 may generate the counting signal INC which is enabled if the first sensing signal OUTP and the second sensing signal OUTN have different logic levels.

The reset signal generation circuit 52 may include a delay 521 and an OR gate OR51. The delay 521 may output the counting signal INC by delaying the counting signal INC by a predetermined period. The OR gate OR51 may perform an OR logic function on the counting signal INC and the output of the delay 521, and output the reset signal RSTB. In other words, the reset signal generation circuit 52 may generate the reset signal RSTB which has the pulse generated for a predetermined period, in response to the counting signal INC when, in one example, the counting signal INC transitions to the logic low level. The pulse of the reset signal RSTB may be set to the logic low level.

Figure 6:
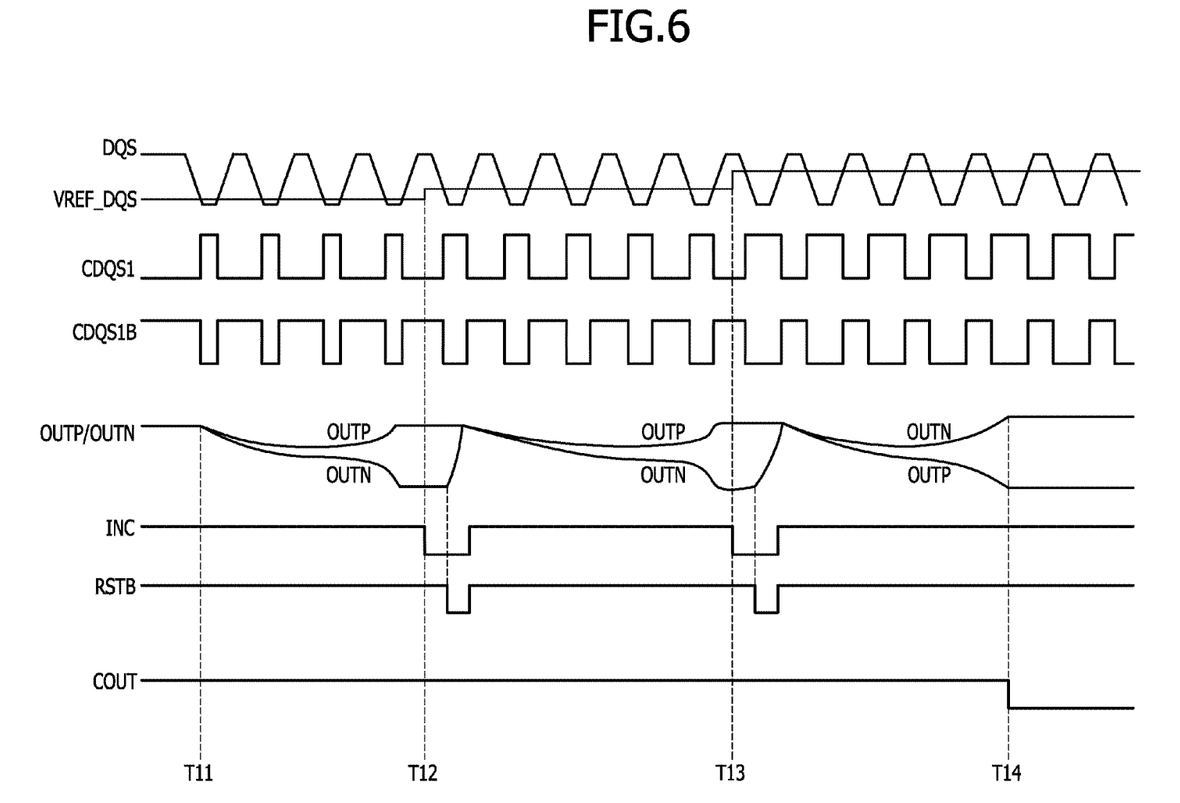
FIG. 6 is a representation of an example timing diagram to assist in an explanation of operation of the semiconductor system shown in FIGS. 1 to 5.

Describing the operation of the semiconductor system in accordance with the embodiment with reference to FIG. 6, in the case where the training mode is entered, the voltage code VCODE<1:N> may be initialized, and the voltage level of the reference voltage VREF_DQS may be set to the lowest level. The first sensing signal OUTP and the second sensing signal OUTN may be initialized to the logic high levels.

From a time T11, the second semiconductor device 12 may be inputted with the strobe signal DQS which toggles. The comparison circuit 16 may compare the strobe signal DQS and the reference voltage VREF_DQS, and generate the first comparison strobe signal CDQS1. The first comparison strobe signal CDQS1 may have the logic high level if the voltage level of the strobe signal DQS is lower than the voltage level of the reference voltage VREF_DQS. The first comparison strobe signal CDQS1 may have the logic low level if the voltage level of the strobe signal DQS is higher than the voltage level of the reference voltage VREF_DQS. The inverted comparison strobe signal CDQS1B may be generated by inverting the first comparison strobe signal CDQS1. Since the logic high level period of the first comparison strobe signal CDQS1 is shorter than the logic low level period of the first comparison strobe signal CDQS1 from the time T11 to a time T12, the period sensing circuit 211 may generate the first sensing signal OUTP of the logic high level and the second sensing signal OUTN of the logic low level at the time T12. The logic level comparison circuit 212 may generate the duty ratio sensing signal COUT of the logic high level in response to the first sensing signal OUTP of the logic high level and the second sensing signal OUTN of the logic low level. The control signal generation circuit 213 may generate the counting signal INC which transitions to the logic low level at the time T12, in response to the second sensing signal OUTN of the logic low level, and generate the reset signal RSTB including the pulse of the logic low level in response to generating the counting signal INC. The counter 221 may count the voltage code VCODE<1:N> in response to the counting signal INC at the time T12. The reference voltage output circuit 222 may raise the reference voltage VREF_DQS by a predetermined level in response to the counted voltage code VCODE<1:N> at the time T12. The period sensing circuit 211 may initialize the first sensing signal OUTP and the second sensing signal OUTN to the logic high levels in response to the reset signal RSTB. The logic level comparison circuit 212 may latch the duty ratio sensing signal COUT of the logic high level in response to the first sensing signal OUTP and the second sensing signal OUTN of the logic high levels.

Since the logic high level period of the first comparison strobe signal CDQS1 is shorter than the logic low level period of the first comparison strobe signal CDQS1 from a time at which the first sensing signal OUTP and the second sensing signal OUTN are initialized to the logic high levels to a time T13, the period sensing circuit 211 may generate the first sensing signal OUTP of the logic high level and the second sensing signal OUTN of the logic low level at the time T13. The logic level comparison circuit 212 may generate the duty ratio sensing signal COUT of the logic high level in response to the first sensing signal OUTP of the logic high level and the second sensing signal OUTN of the logic low level. The control signal generation circuit 213 may generate the counting signal INC which transitions to the logic low level at the time T13, in response to the second sensing signal OUTN of the logic low level, and generate the reset signal RSTB including the pulse of the logic low level in response to generating the counting signal INC. The counter 221 may count the voltage code VCODE<1:N> in response to the counting signal INC at the time T13. The reference voltage output circuit 222 may raise the reference voltage VREF_DQS by a predetermined level in response to the counted voltage code VCODE<1:N> at the time T13. The period sensing circuit 211 may initialize the first sensing signal OUTP and the second sensing signal OUTN to the logic high levels in response to the reset signal RSTB. The logic level comparison circuit 212 may latch the duty ratio sensing signal COUT of the logic high level in response to the first sensing signal OUTP and the second sensing signal OUTN of the logic high levels.

In the period sensing circuit 211, as the voltage level of the reference voltage VREF_DQS is raised, from a time at which the first sensing signal OUTP and the second sensing signal OUTN are initialized to the logic high levels to a time T14, the logic high level period of the first comparison strobe signal CDQS1 may become longer than the logic low level period of the first comparison strobe signal CDQS1. Accordingly, the period sensing circuit 211 may generate the first sensing signal OUTP of the logic low level and the second sensing signal OUTN of the logic high level at the time T14. The logic level comparison circuit 212 may generate the duty ratio sensing signal COUT of the logic low level in response to the first sensing signal OUTP of the logic low level and the second sensing signal OUTN of the logic high level. The counter 221 may store the voltage code VCODE<1:N> in response to the duty ratio sensing signal COUT of the logic low level, and output the stored voltage code VCODE<1:N>. The reference voltage output circuit 222 may output the reference voltage VREF_DQS with a level corresponding to the voltage code VCODE<1:N> which is outputted from the counter 221, and the training mode may be ended.

As is apparent from the above descriptions, the semiconductor system in accordance with an embodiment provides advantages in that, by training a reference voltage for determining the logic level of a strobe signal and by controlling a data input buffer according to a result of comparing the reference voltage and the strobe signal, it is possible to prevent an occurrence of an operation error in the data input buffer.

Figure 7:
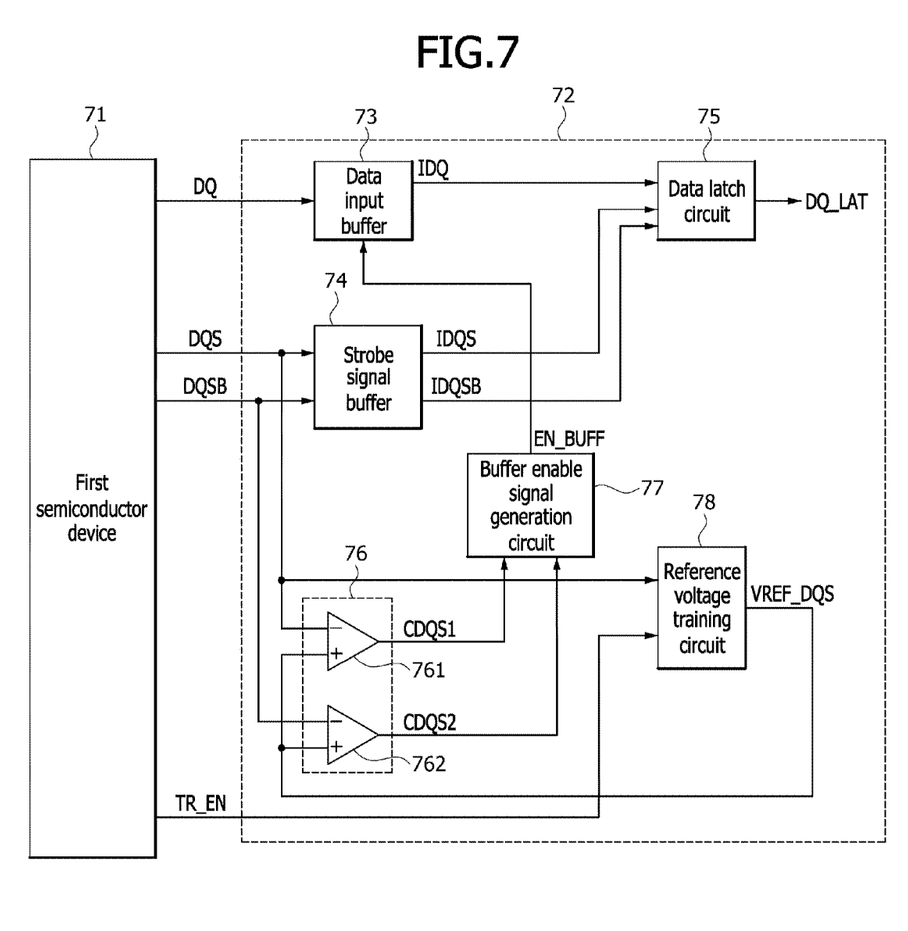
FIG. 7 is a block diagram illustrating a representation of an example configuration of a semiconductor system in accordance with another embodiment.

As shown in FIG. 7, a semiconductor system in accordance with another embodiment may be constructed by a first semiconductor device 71 and a second semiconductor device 72.

The first semiconductor device 71 may output data DQ, a strobe signal DQS, an inverted strobe signal DQSB, and a training entry signal TR_EN. The first semiconductor device 71 may output the data DQ, the strobe signal DQS, and the inverted strobe signal DQSB when a write operation for the second semiconductor device 72 is performed. The first semiconductor device 71 may output the training entry signal TR_EN for entering a training mode. The training mode may be an operation for setting the voltage level of a reference voltage VREF_DQS which is generated in the second semiconductor device 72. The training entry signal TR_EN may be transmitted through a line through which a command, an address and data are transmitted. The first semiconductor device 71 may output the strobe signal DQS which has a predetermined logic level in the training mode. The strobe signal DQS may have a logic low level in the training mode.

The second semiconductor device 72 may include a data input buffer 73, a strobe signal buffer 74, a data latch circuit 75, a comparison circuit 76, a buffer enable signal generation circuit 77, and a reference voltage training circuit 78.

The data input buffer 73 may buffer the data DQ and generate internal data IDQ, in response to a buffer enable signal EN_BUFF. The data input buffer 73 may buffer the data DQ and generate the internal data IDQ, for a period in which the buffer enable signal EN_BUFF is enabled.

The strobe signal buffer 74 may buffer the strobe signal DQS and the inverted strobe signal DQSB, and may generate an internal strobe signal IDQS and an inverted internal strobe signal IDQSB. The strobe signal buffer 74 may generate the internal strobe signal IDQS by buffering the strobe signal DQS. The strobe signal buffer 74 may generate the inverted internal strobe signal IDQSB by buffering the inverted strobe signal DQSB. The strobe signal buffer 74 may include a divider circuit. The strobe signal buffer 74 including a divider circuit may divide the strobe signal DQS and the inverted strobe signal DQSB, and may generate the internal strobe signal IDQS and the inverted internal strobe signal IDQSB.

The data latch circuit 75 may latch the internal data IDQ in response to the internal strobe signal IDQS and the inverted internal strobe signal IDQSB. The data latch circuit 75 may align the latched internal data IDQ, and generate latched data DQ_LAT. The data latch circuit 75 may latch in parallel the data inputted in series through the internal data IDQ, in response to the internal strobe signal IDQS and the inverted internal strobe signal IDQSB. The data latch circuit 75 may align the latched data, and generate latched data DQ_LAT.

The comparison circuit 76 may include a first comparator 761 and a second comparator 762.

The first comparator 761 may compare the strobe signal DQS and the reference voltage VREF_DQS, and may generate a first comparison strobe signal CDQS1. The first comparator 761 may generate the first comparison strobe signal CDQS1 of a logic high level if the level of the strobe signal DQS is lower than the level of the reference voltage VREF_DQS. The first comparator 761 may generate the first comparison strobe signal CDQS1 of a logic low level if the level of the strobe signal DQS is higher than the level of the reference voltage VREF_DQS. The logic level of the first comparison strobe signal CDQS1 generated by comparing the strobe signal DQS and the reference voltage VREF_DQS may be set differently according to an embodiment.

The second comparator 762 may compare the inverted strobe signal DQSB and the reference voltage VREF_DQS, and may generate a second comparison strobe signal CDQS2. The second comparator 762 may generate the second comparison strobe signal CDQS2 of a logic high level if the level of the inverted strobe signal DQSB is lower than the level of the reference voltage VREF_DQS. The second comparator 762 may generate the second comparison strobe signal CDQS2 of a logic low level if the level of the inverted strobe signal DQSB is higher than the level of the reference voltage VREF_DQS. The logic level of the second comparison strobe signal CDQS2 generated by comparing the inverted strobe signal DQSB and the reference voltage VREF_DQS may be set differently according to an embodiment.

The buffer enable signal generation circuit 77 may generate the buffer enable signal EN_BUFF which is enabled when the first comparison strobe signal CDQS1 and the second comparison strobe signal CDQS2 toggle to different logic levels.

The reference voltage training circuit 78 may compare a voltage level of a power supply voltage VDD (see FIG. 8) and a voltage level of the strobe signal DQS and set the voltage level of the reference voltage VREF_DQS, in response to the training entry signal TR_EN. The reference voltage training circuit 78 may set the voltage level of the reference voltage VREF_DQS to a value between the voltage level of the strobe signal DQS which is set to the predetermined level and the voltage level of the power supply voltage VDD, if the training mode is entered in response to the training entry signal TR_EN. The level to which the strobe signal DQS is set in the training mode may be a logic low level.

Figure 8:
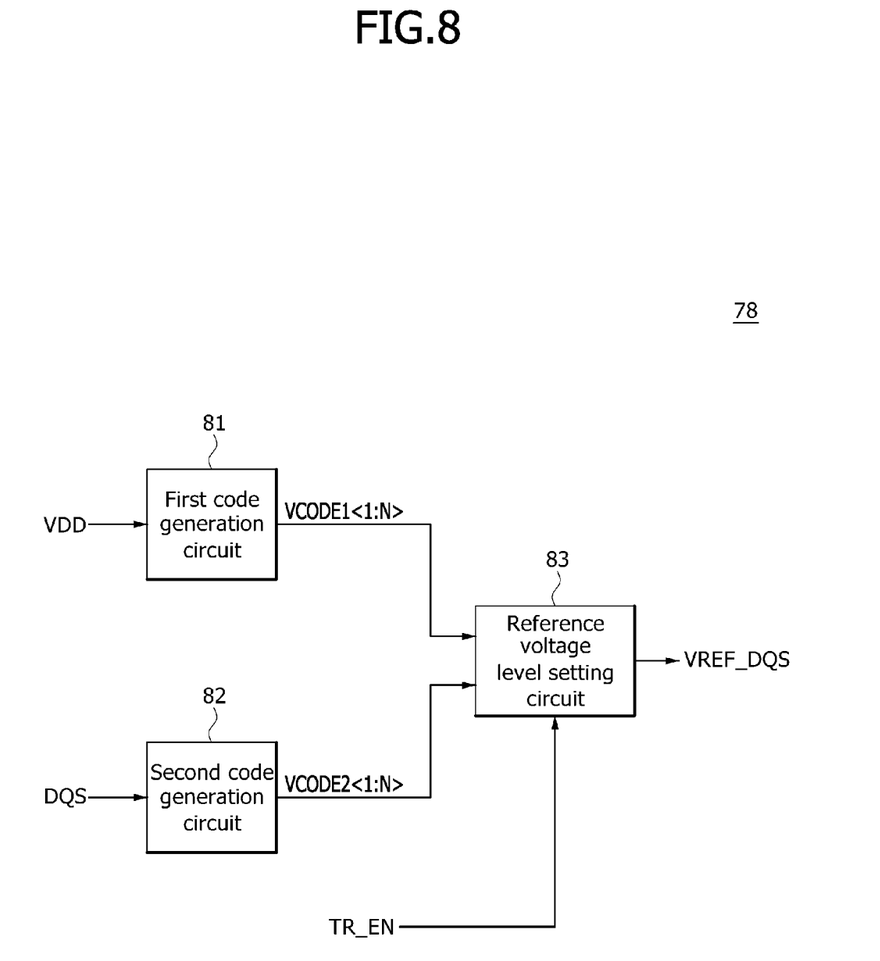
FIG. 8 is a block diagram illustrating a representation of an example reference voltage training circuit included in the semiconductor system shown in FIG. 7.

Referring to FIG. 8, the reference voltage training circuit 78 may include a first code generation circuit 81, a second code generation circuit 82, and a reference voltage level setting circuit 83.

The first code generation circuit 81 may be inputted with the power supply voltage VDD, and may generate a first voltage code VCODE1<1:N>. The first code generation circuit 81 may generate the first voltage code VCODE1<1:N> corresponding to the voltage level of the power supply voltage VDD. The logic level combination of the first voltage code VCODE1<1:N> corresponding to the voltage level of the power supply voltage VDD may be set variously according to embodiments. According to an embodiment, the first code generation circuit 81 may be inputted with a ground voltage (not shown), and generate the first voltage code VCODE1<1:N> corresponding to the voltage level of the ground voltage.

The second code generation circuit 82 may be inputted with the strobe signal DQS, and may generate a second voltage code VCODE2<1:N>. The second code generation circuit 82 may generate the second voltage code VCODE2<1:N> corresponding to the voltage level of the strobe signal DQS which is set to the logic low level in the training mode. The logic level combination of the second voltage code VCODE2<1:N> corresponding to the voltage level of the strobe signal DQS which is set to the logic low level may be set variously according to embodiments. According to an embodiment, the second code generation circuit 82 may be inputted with the strobe signal DQS which is set to a logic high level, and may generate a second voltage code VCODE2<1:N> corresponding to the voltage level of the strobe signal DQS.

The reference voltage level setting circuit 83 may set and generate the reference voltage VREF_DQS which has a voltage level corresponding to a code value between the first voltage code VCODE1<1:N> and the second voltage code VCODE2<1:N>, in response to the training entry signal TR_EN. The reference voltage level setting circuit 83 may calculate and store the code value by comparing the first voltage code VCODE1<1:N> and the second voltage code VCODE2<1:N>, if the training mode is entered in response to the training entry signal TR_EN. The reference voltage level setting circuit 83 may generate the reference voltage VREF_DQS which has a voltage level corresponding to the stored code value.

As is apparent from the above descriptions, the semiconductor system in accordance with the embodiment provides advantages in that, by generating a reference voltage having a level between the strobe signal having a predetermined level in a training mode and a power supply voltage, it is possible to shorten a time required for a training operation.

The semiconductor device described above with reference to FIGS. 1 to 8 may be applied to an electronic system which includes a memory system, a graphic system, a computing system or a mobile system. For example, referring to FIG. 9, an electronic system 1000 in accordance with an embodiment may include a data storage 1001, a memory controller 1002, a buffer memory 1003, and an input/output interface 1004.

Figure 9:
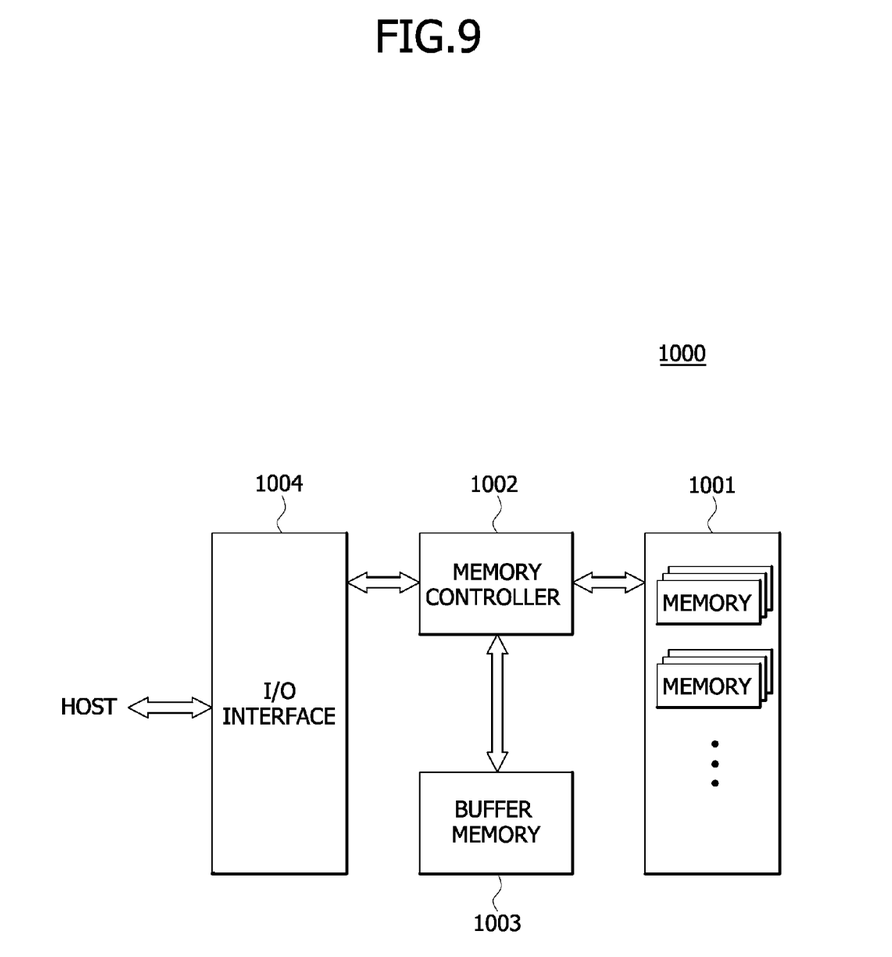
FIG. 9 is a block diagram illustrating a representation of an example configuration of an electronic system to which the semiconductor system shown in FIGS. 1 to 8 is applied.

The data storage 1001 stores data applied from the memory controller 1002, and reads out the stored data and outputs the read-out data to the memory controller 1002, according to control signals from the memory controller 1002. The data storage 1001 may include the second semiconductor device 12 shown in FIG. 1 or the second semiconductor device 72 shown in FIG. 7. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM), or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. The memory controller 1002 may include the first semiconductor device 11 shown in FIG. 1 or the first semiconductor device 71 shown in FIG. 7. While the memory controller 1002 is illustrated as one block in FIG. 9, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM, and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor device comprising:
    a comparison circuit configured to compare a reference voltage and a strobe signal, and to generate a first comparison strobe signal; and
    a reference voltage training circuit configured to sequentially change a voltage level of the reference voltage if a training mode is entered, and to set the voltage level of the reference voltage by sensing a duty ratio of the first comparison strobe signal,
    wherein the reference voltage training circuit comprises:
        a duty ratio sensing circuit configured to compare a period in which the first comparison strobe signal has the first logic level and a period in which the first comparison strobe signal has the second logic level, and to generate a duty ratio sensing signal and a counting signal; and
        a reference voltage generation circuit configured to initialize the reference voltage in response to a training entry signal which is enabled in the training mode, to sequentially change the voltage level of the reference voltage in response to the counting signal, and to set the voltage level of the reference voltage in response to the duty ratio sensing signal.

2. The semiconductor device according to claim 1, wherein the reference voltage training circuit raises the voltage level of the reference voltage by a predetermined voltage level, if a period in which the first comparison strobe signal has the second logic level is shorter than a period in which the first comparison strobe signal has the first logic level, in a state in which the voltage level of the reference voltage is set to a lowest voltage level.

3. The semiconductor device according to claim 2, wherein the reference voltage training circuit fixes the voltage level of the reference voltage and a training operation is ended, if a period in which the first comparison strobe signal has the second logic level is longer than a period in which the first comparison strobe signal has the first logic level.

4. The semiconductor device according to claim 1, wherein the duty ratio sensing circuit comprises:
    a period sensing circuit configured to generate a first sensing signal and a second sensing signal by comparing a period in which the first comparison strobe signal has the first logic level and a period in which the first comparison strobe signal has the second logic level, and to initialize the first sensing signal and the second sensing signal in response to a reset signal;
    a logic level comparison circuit configured to generate the duty ratio sensing signal which transitions levels in response to the first sensing signal and the second sensing signal; and
    a control signal generation circuit configured to generate the counting signal and the reset signal if a duty ratio of the first comparison strobe signal is sensed in response to the first sensing signal and the second sensing signal.

5. The semiconductor device according to claim 4, wherein the period sensing circuit comprises:
    an inversion circuit configured to invert and buffer the first comparison strobe signal, and to generate an inverted comparison strobe signal;
    a first transfer circuit configured to transfer the first comparison strobe signal as a transfer strobe signal in response to the reset signal;
    a second transfer circuit configured to transfer the inverted comparison strobe signal as an inverted transfer strobe signal in response to the reset signal;
    a sensing circuit configured to generate the first sensing signal and the second sensing signal by comparing a period in which the transfer strobe signal is a first logic level and a period in which the inverted transfer strobe signal is a first logic level;
    a first reset element configured to initialize the first sensing signal in response to the reset signal; and
    a second reset element configured to initialize the second sensing signal in response to the reset signal.

6. The semiconductor device according to claim 4, wherein the logic level comparison circuit comprises:
    a first NAND gate configured to NAND operate the first sensing signal and a first latch signal, and to generate a second latch signal;
    a second NAND gate configured to NAND operate the second latch signal and the second sensing signal, and to generate the first latch signal; and an inverter configured to invert and buffer the second latch signal, and to generate the duty ratio sensing signal.

7. The semiconductor device according to claim 4, wherein the control signal generation circuit comprises:
a counting signal generation circuit configured to generate the counting signal which is enabled if the first sensing signal and the second sensing signal have different logic levels; and
a reset signal generation circuit configured to generate the reset signal which has a predetermined pulse width, in response to the counting signal.

8. The semiconductor device according to claim 1, wherein the reference voltage generation circuit comprises:
a counter configured to initialize a voltage code in response to the training entry signal, to generate the voltage code which is counted in response to the counting signal, and to store the voltage code in the case where the duty ratio sensing signal transitions in its level; and
a reference voltage output circuit configured to output the reference voltage which has a voltage level corresponding to the voltage code.

9. The semiconductor device according to claim 1, further comprising:
a buffer enable signal generation circuit configured to generate a buffer enable signal which is enabled in a period in which the first comparison strobe signal and a second comparison strobe signal toggle to different logic levels,
wherein the second comparison strobe signal is generated by comparing an inverted strobe signal generated by inverting the strobe signal and the reference voltage, and the buffer enable signal enables a data input buffer.

10. The semiconductor device according to claim 1, wherein, the strobe signal is a signal which toggles in the training mode.

11. A semiconductor system comprising:
a first semiconductor device suitable for outputting data, a strobe signal, an inverted strobe signal, and a training entry signal; and
a second semiconductor device configured to generate a first comparison strobe signal by comparing a reference voltage and the strobe signal, and to set a voltage level of the reference voltage by sensing a duty ratio of the first comparison strobe signal through sequentially changing the voltage level of the reference voltage in the case where a training mode is entered in response to the training entry signal,
wherein the second semiconductor device comprises:
a data input buffer configured to buffer the data and to generate internal data, in response to a buffer enable signal;
a comparison circuit configured to generate the first comparison strobe signal by comparing the reference voltage and the strobe signal, and to generate a second comparison strobe signal by comparing the reference voltage and the inverted strobe signal;
a buffer enable signal generation circuit configured to generate the buffer enable signal which is enabled in a period in which the first comparison strobe signal and the second comparison strobe signal toggle to different logic levels; and
a reference voltage training circuit configured to set the voltage level of the reference voltage by sensing the duty ratio of the first comparison strobe signal and configured to sequentially change the voltage level of the reference voltage in the training mode.

12. The semiconductor system according to claim 11, wherein the second semiconductor device raises the voltage level of the reference voltage by a predetermined voltage level, if a period in which the first comparison strobe signal has a second logic level is shorter than a period in which the first comparison strobe signal has a first logic level, in a state in which the voltage level of the reference voltage is set to a lowest voltage level.

13. The semiconductor system according to claim 12, wherein the second semiconductor device fixes the voltage level of the reference voltage and a training operation is ended, if a period in which the first comparison strobe signal has the second logic level is longer than a period in which the first comparison strobe signal has the first logic level.

14. The semiconductor system according to claim 11, wherein the reference voltage training circuit comprises:
a duty ratio sensing circuit configured to compare a period in which the first comparison strobe signal has the first logic level and a period in which the first comparison strobe signal has the second logic level, and to generate a duty ratio sensing signal and a counting signal; and
a reference voltage generation circuit configured to initialize the reference voltage in response to the training entry signal which is enabled in the training mode, to sequentially change the voltage level of the reference voltage in response to the counting signal, and to set the voltage level of the reference voltage in response to the duty ratio sensing signal.

15. The semiconductor system according to claim 14, wherein the duty ratio sensing circuit comprises:
a period sensing circuit configured to generate a first sensing signal and a second sensing signal by comparing a period in which the first comparison strobe signal has the first logic level and a period in which the first comparison strobe signal has the second logic level, and to initialize the first sensing signal and the second sensing signal in response to a reset signal;
a logic level comparison circuit configured to generate the duty ratio sensing signal which transitions levels in response to the first sensing signal and the second sensing signal; and
a control signal generation circuit configured to generate the counting signal and the reset signal if a duty ratio of the first comparison strobe signal is sensed in response to the first sensing signal and the second sensing signal.

16. The semiconductor system according to claim 14, wherein the reference voltage generation circuit comprises:
a counter configured to initialize a voltage code in response to the training entry signal, to generate the voltage code which is counted in response to the counting signal, and to store the voltage code in the case where the duty ratio sensing signal transitions in its level; and
a reference voltage output circuit configured to output the reference voltage which has a level corresponding to the voltage code.

17. The semiconductor device according to claim 11, wherein, the strobe signal is a signal which toggles in the training mode.

* * * * *